(12) United States Patent
Chiproot

(10) Patent No.: US 10,364,923 B2
(45) Date of Patent: Jul. 30, 2019

(54) GRIP ELEMENTS FOR GRIP RING

(71) Applicant: Avi Chiproot, Kfar-Saba (IL)

(72) Inventor: Avi Chiproot, Kfar-Saba (IL)

(73) Assignee: Krausz Industries Ltd., Tel Aviv (IL)

( * ) Notice: Subject to any disclaimer, the term of this patent is extended or adjusted under 35 U.S.C. 154(b) by 825 days.

(21) Appl. No.: 14/606,170

(22) Filed: Jan. 27, 2015

(65) Prior Publication Data

US 2016/0215907 A1 Jul. 28, 2016

(51) Int. Cl.
| | |
|---|---|
| *F16L 19/065* | (2006.01) |
| *F16B 2/14* | (2006.01) |
| *F16L 35/00* | (2006.01) |
| *F16L 19/06* | (2006.01) |
| *F16L 37/084* | (2006.01) |

(52) U.S. Cl.
CPC .............. *F16L 19/065* (2013.01); *F16B 2/14* (2013.01); *F16L 19/061* (2013.01); *F16L 37/0842* (2013.01)

(58) Field of Classification Search
CPC ...................... F16L 21/08; F16L 21/007; F16L 19/061–075; F16L 37/0842; F16L 37/092; F16L 37/0925; F16L 37/15; F16B 2/14
USPC .......................................... 285/323, 343, 421
See application file for complete search history.

(56) References Cited

U.S. PATENT DOCUMENTS

| | | | |
|---|---|---|---|
| 2,755,109 A | 7/1956 | Risley | |
| 2,779,610 A * | 1/1957 | Risley | F16L 19/086 285/323 |
| 3,980,325 A | 9/1976 | Robertson | |
| 4,430,523 A * | 2/1984 | Hayes | H01R 13/5812 174/135 |
| 5,335,946 A * | 8/1994 | Dent | F16L 21/04 285/243 |
| 5,947,532 A * | 9/1999 | Lorenz | F16L 37/0925 285/321 |
| 7,571,940 B2 * | 8/2009 | Krausz | F16L 21/022 285/323 |
| 7,837,238 B2 * | 11/2010 | Krausz | F16L 19/061 285/323 |
| 8,025,318 B1 | 9/2011 | Morroney | |
| 2004/0007874 A1 * | 1/2004 | Minami | F16L 19/086 285/355 |
| 2004/0051259 A1 * | 3/2004 | Belik | B25B 5/147 279/152 |
| 2004/0090067 A1 * | 5/2004 | Pridham | F16L 19/065 285/328 |

(Continued)

FOREIGN PATENT DOCUMENTS

| | | | |
|---|---|---|---|
| DE | 102010036160 | 3/2012 | |
| EP | 0066742 A1 * | 12/1982 | ............ F16L 33/223 |

(Continued)

OTHER PUBLICATIONS

European Search Report EP16151865, dated Jun. 24, 2016.

*Primary Examiner* — James M Hewitt, II
*Assistant Examiner* — Stacy N Lawson
(74) *Attorney, Agent, or Firm* — Dekel Patent Ltd.; David Klein

(57) ABSTRACT

A grip element has a wedge shape including a wedging surface. One or more sets of elongate teeth are on the wedging surface. Another set of teeth with pointed corners are spaced from the elongate teeth in the circumferential direction. The grip element may be non-stamped.

13 Claims, 3 Drawing Sheets

(56) References Cited

U.S. PATENT DOCUMENTS

| | | | |
|---|---|---|---|
| 2009/0140520 A1* | 6/2009 | Krausz | F16L 21/022 |
| | | | 285/340 |
| 2010/0176588 A1* | 7/2010 | Krausz | F16L 19/061 |
| | | | 285/339 |
| 2013/0082463 A1* | 4/2013 | Benson | F16L 21/04 |
| | | | 285/344 |
| 2015/0204468 A1* | 7/2015 | Jones | F16L 17/035 |
| | | | 285/110 |

FOREIGN PATENT DOCUMENTS

| | | | |
|---|---|---|---|
| EP | 1380788 | 1/2004 | |
| FR | 2280850 | 2/1976 | |
| GB | 1334339 | 10/1973 | |
| GB | 2474899 | 5/2011 | |
| WO | WO-2009060462 A1 * | 5/2009 | F16L 37/0925 |

\* cited by examiner

GRIP ELEMENTS FOR GRIP RING

FIELD OF THE INVENTION

The present invention relates generally to clamps and couplings for pipes, and particularly to grip elements used in grip rings of clamps and couplings for gripping plastic or metal pipes, or any other materials.

BACKGROUND OF THE INVENTION

U.S. Pat. No. 7,837,238 to Krausz describes a pipe coupling that combines an elastomeric seal member with a grip ring. The grip ring is formed of wedge-shaped grip elements that are radially spaced from one another. The grip elements are formed with teeth that face inwards towards the center of the ring. A single fastener (e.g., bolt and nut or other tightenable screw) is provided, which when tightened in a direction transverse to the axial length of the pipe, presses both the elastomeric seal member and the grip ring against the surface of the pipe.

FIGS. 1A and 1B illustrate the prior art grip element 1 of U.S. Pat. No. 7,837,238. Grip element 1 is made of sheet metal, such as a medium-hardness steel alloy, by stamping or punching or other sheet metal forming processes. The terms "stamping" and "punching" are used as interchangeable terms in this application. Grip element 1 has a wedge shape including a sloped surface 2 on which teeth 3 and 4 are formed. Grip element 1 is provided with an array of large 3 and small 4 gripping teeth. The sharp edges of all teeth face outwards. The large teeth 3 project from the surface 2 further than the small teeth 4.

Small teeth 4 are shaped as a cluster of pointed barbs, which may be punched out the sheet metal. Large teeth are shaped as oval grater barbs, which may be punched out the sheet metal.

Grip element 1 can be used with both metal and plastic pipes without requiring any adjustment. The larger teeth penetrate the surface of a plastic pipe to a depth sufficient to prevent axial withdrawal. The smaller and thus stronger teeth penetrate the surface of a metal pipe even if the larger teeth collapse.

As is seen in the underside view in FIG. 1B, because grip element 1 is stamped, teeth 3 and 4 are formed all the way through the thickness of sloped surface 2. The "negative" undersides of the teeth 3 and 4 are seen on the back of surface 2.

SUMMARY OF THE INVENTION

The present invention seeks to provide improved grip elements for use with a grip ring assembly. In a non-limiting embodiment the present invention, the grip elements have a set of teeth that extend over at least half the width of a wedging surface of the grip element, and in some embodiments over the entire width of the wedging surface. Gaps may be formed between teeth on the same row of teeth.

In a non-limiting embodiment the present invention, the grip elements are non-stamped grip elements.

In a non-limiting embodiment the present invention, the grip elements have strengthening ribs on the underside of the wedging surface of the grip element.

In a non-limiting embodiment the present invention, the teeth of the grip elements cannot be seen on the underside of the wedging surface of the grip element.

BRIEF DESCRIPTION OF THE DRAWINGS

The present invention will be understood and appreciated more fully from the following detailed description, taken in conjunction with the drawing in which:

FIGS. 4A-4B, 5A-5B, 6A-6B and 7A-7B are simplified pictorial and front-view illustrations, respectively, of grip elements constructed and operative in accordance with other embodiments of the present invention.

DETAILED DESCRIPTION OF EMBODIMENTS

Figure 1A:
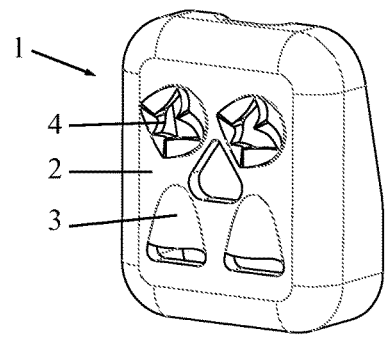
FIGS. 1A and 1B are simplified pictorial illustrations of the prior art grip element 1 of U.S. Pat. No. 7,837,238.
Figure 1B:
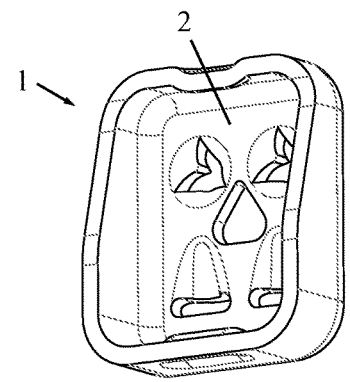
Figure 2A:
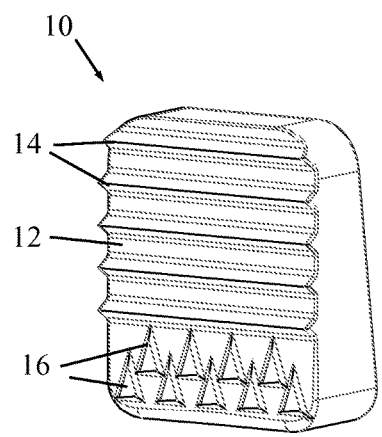
FIGS. 2A and 2B are simplified pictorial illustrations of a grip element constructed and operative in accordance with a non-limiting embodiment of the present invention, respectively showing the top and undersides of a wedging gripping surface of the grip element.
Figure 2B:
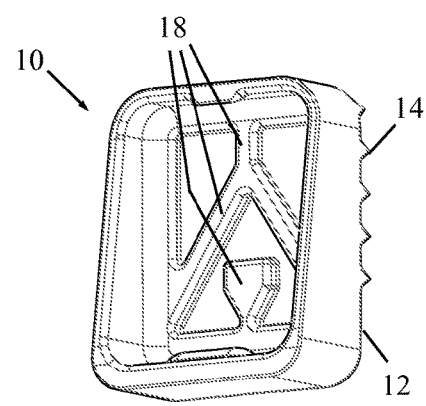

Reference is now made to FIGS. 2A-B, which illustrate a grip element 10, constructed and operative in accordance with a non-limiting embodiment of the present invention.

Grip element 10 has a wedge shape including a wedging surface 12 on which teeth are formed. The wedging surface 12 may be sloped or it may be horizontal, in which case the grip element is arranged on a grip ring of a pipe coupling (the terms "clamp" and "coupling" are used interchangeably) so that the surface is inclined to provide a wedging action against a pipe when the pipe coupling is tightened against the pipe. Grip element 10 includes a first set of teeth 14 that extend over at least half the width of wedging surface 12. In the illustrated embodiment, teeth 14 extend over the entire width of wedging surface 12. Teeth 14 provide a substantial improvement the prior art barbed gripping teeth. First, the longer length makes the teeth stronger and much more resistant to collapse and to forces that can blunt or otherwise damage the teeth. Second, the longer length means the teeth bite into the surface of the pipe (not shown) with at least the same force but with significantly less pressure, since the force is spread over a greater area. This is particularly advantageous for plastic pipes or other materials softer than metal.

Grip element 10 may include a second set of teeth 16, which are shorter than teeth 14. Teeth 16 may have a pointed (e.g., triangular) shape or other kind of shapes.

The longer teeth 14 may project from the wedging surface 12 more than the shorter teeth 16. Alternatively, longer teeth 14 may project from the wedging surface 12 less than or equal to the shorter teeth 16. Still alternatively, some of the longer teeth 14 may project from the wedging surface 12 more than the shorter teeth 16 while others of the longer teeth 14 may project from the wedging surface 12 lees than or equal to the shorter teeth 16.

In the embodiment of FIGS. 2A-2B, teeth 14 are parallel to each other. Alternative embodiments of grip element 10 are now described with reference to FIGS. 4A-4B, 5A-5B, 6A-6B and 7A-7B.

Figure 4A:
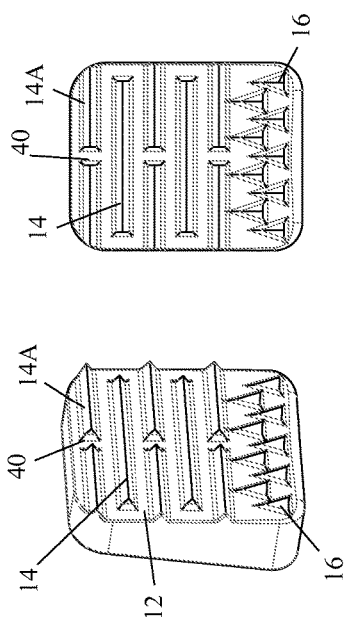

In FIGS. 4A-4B, there are rows of longer teeth parallel to each other, but the rows have alternating sizes of teeth—in one row the teeth 14 are the full width of the grip element whereas in the adjacent row the teeth 14A are almost half-width with a gap 40 between them. This is called a staggered teeth arrangement; the staggering can be in other patterns, such as with more than one gap in a row or zigzag patterns or in which the teeth or rows of teeth are not parallel to each other. It is believed gap 40 enhances the gripping strength by allowing the ends of the teeth dig into the pipe. Shorter teeth 16 are also provided.

Figure 5A:
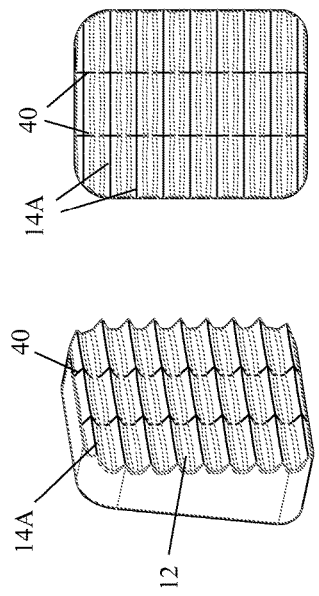

In FIGS. 5A-5B, there are only rows of longer teeth with no shorter teeth. There are two gaps 40 between adjacent teeth 14A with no staggering. In FIGS. 4A-5B, the wedging surface 12 is flat.

Figure 6A:
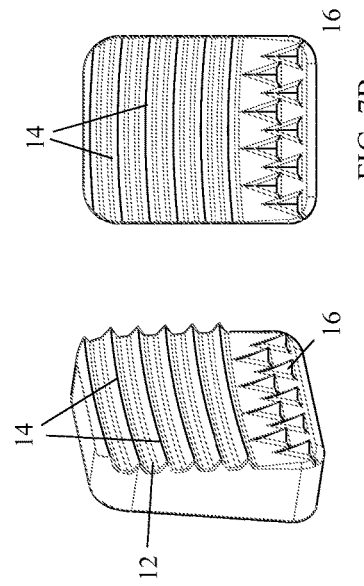
Figure 7A:
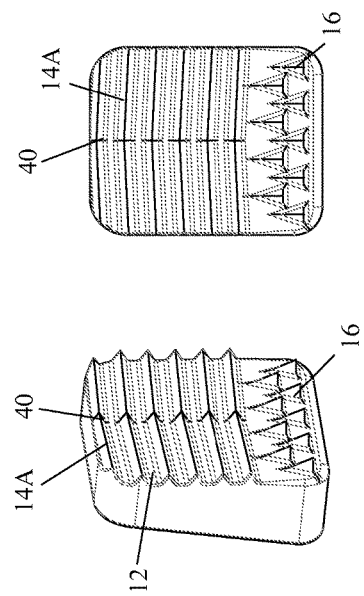

In FIGS. 6A-6B as well as FIGS. 7A-7B, there are rows of longer teeth 14A and shorter teeth 16 are also provided. In FIGS. 6A-6B, there is one gap 40 in each row, and the wedging surface 12 is V-shaped. In FIGS. 7A-7B, there are no gaps, and the wedging surface 12 is curved (concave). Of course, any combinations of curved, flat and V-shaped wedging surfaces with any number of gaps, with or without staggering and with or without shorter teeth may be used. In any of the embodiments, at least some of teeth 14 may be non-parallel to other teeth 14. At least some of the teeth 14 may be slanted or curved or face in different directions, depending on the need and application.

The longer teeth 14 or 14A are called elongate teeth, defined as a tooth whose length is at least four times larger than its width measured at its base (wherein it meets the wedging surface).

In a non-limiting embodiment the present invention, grip element 10 is a non-stamped grip element. For example, grip element 10 may be made of metal injection molding (MIM), or may be cast or machined. As seen in the illustrated embodiment, the grip element 10 has strengthening ribs 18 formed on the underside of the wedging surface 12. Unlike the prior art, the teeth of the grip element 10 cannot be seen on the underside of the wedging surface 12. This improves the strength of the grip element.

Grip element 10 can be used with metal and plastic pipes (or any other material) without requiring any adjustment.

Figure 3:
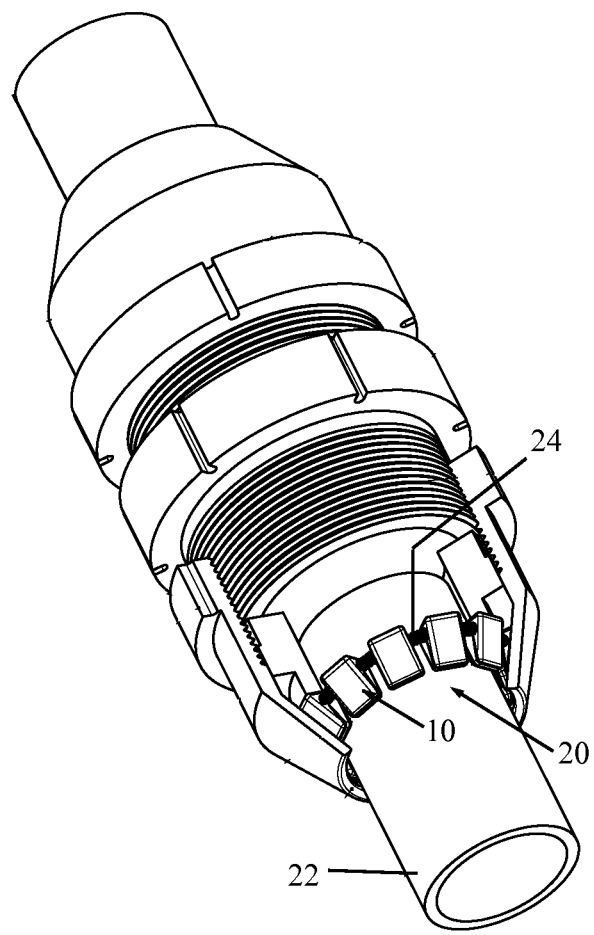
FIG. 3 is a simplified illustration of a grip ring assembly, constructed and operative in accordance with a non-limiting embodiment of the present invention, using the grip elements of FIGS. 2A and 2B.

FIG. 3 illustrates a grip ring assembly 20, constructed and operative in accordance with a non-limiting embodiment of the present invention, using the grip elements 10 (or alternatively the grip elements of FIGS. 4A-7B). Grip elements 10 are wedge-shaped and the teeth project towards the outer surface of a pipe 22. Links 24 (which may be springs or flexible links, for example) are affixed to side portions of adjacent grip elements 10.

What is claimed is:

1. An article comprising:
   an accessory for a clamp assembly comprising a grip element that has a wedge shape including a wedging surface, and rows of elongate teeth on said wedging surface, wherein said teeth are elongate in a circumferential direction, said rows being spaced from one another in an axial direction, wherein said elongate teeth in at least one of the rows are separated from each other by a gap in said circumferential direction, and said wedging surface further comprising at least two rows of polygonal teeth shaped as a triangle, as viewed in a direction perpendicular to both said circumferential and axial directions, said polygonal teeth being spaced from said rows of elongate teeth in the axial direction, and wherein a portion of at least one of the polygonal teeth in one of the rows of said polygonal teeth extends into a space between two adjacent polygonal teeth of another one of the rows of said polygonal teeth.

2. The article according to claim 1, wherein at least some of said teeth extend over an entire width of said wedging surface.

3. The article according to claim 1, wherein some of said elongate teeth are shorter than some of said polygonal teeth.

4. The article according to claim 1, wherein the triangle has pointed corners.

5. The article according to claim 1, wherein said rows of said elongate teeth are parallel to each other.

6. The article according to claim 1, wherein said grip element comprises strengthening ribs formed on an underside of said wedging surface.

7. The article according to claim 1, wherein said triangle is an isosceles triangle.

8. The article according to claim 1, wherein said wedging surface is flat.

9. The article according to claim 1, wherein said wedging surface is V-shaped.

10. The article according to claim 1, wherein said wedging surface is curved.

11. The article according to claim 1, wherein said elongate teeth are arranged in staggered rows.

12. An article comprising:
    an accessory for a clamp assembly comprising a grip element that has a wedge shape including a wedging surface, and rows of elongate teeth on said wedging surface, wherein said teeth are elongate in a circumferential direction, said rows being spaced from one another in an axial direction, and said wedging surface further comprising at least two rows of polygonal teeth shaped as a triangle, as viewed in a direction perpendicular to both said circumferential and axial directions, said polygonal teeth being spaced from said rows of elongate teeth in the axial direction, and wherein a portion of at least one of the polygonal teeth in one of the rows of said polygonal teeth extends into a space between two adjacent polygonal teeth of another one of the rows of said polygonal teeth.

13. The article according to claim 12, wherein the triangle has pointed corners.

* * * * *